United States Patent
Shao

(10) Patent No.: US 11,336,168 B2
(45) Date of Patent: May 17, 2022

(54) MEASURING CURRENT IN A CONSTANT ON-TIME REGULATOR

(71) Applicant: NXP B.V., Eindhoven (NL)

(72) Inventor: Bin Shao, Chandler, AZ (US)

(73) Assignee: NXP B.V., Eindhoven (NL)

( * ) Notice: Subject to any disclaimer, the term of this patent is extended or adjusted under 35 U.S.C. 154(b) by 339 days.

(21) Appl. No.: 16/523,374

(22) Filed: Jul. 26, 2019

(65) Prior Publication Data

US 2021/0028685 A1 Jan. 28, 2021

(51) Int. Cl.
| | |
|---|---|
| H02M 1/14 | (2006.01) |
| H02M 1/088 | (2006.01) |
| G01R 19/00 | (2006.01) |
| H02M 3/155 | (2006.01) |
| H02M 1/00 | (2006.01) |

(52) U.S. Cl.
CPC ............ *H02M 1/14* (2013.01); *G01R 19/003* (2013.01); *H02M 1/088* (2013.01); *H02M 3/155* (2013.01); *H02M 1/0009* (2021.05)

(58) Field of Classification Search
None
See application file for complete search history.

(56) References Cited

U.S. PATENT DOCUMENTS

| | | | | |
|---|---|---|---|---|
| 9,219,414 | B2 | 12/2015 | Shao | |
| 10,186,967 | B2* | 1/2019 | Huang | .................. H02M 3/158 |
| 2009/0243577 | A1* | 10/2009 | Lim | ..................... H02M 3/1588 |
| | | | | 323/283 |
| 2016/0036326 | A1* | 2/2016 | Sreenivas | ............. H02M 3/158 |
| | | | | 323/271 |
| 2018/0294726 | A1* | 10/2018 | Priego | ................. H02M 3/1584 |

\* cited by examiner

*Primary Examiner* — Daniel C Puentes

(57) ABSTRACT

A current monitor includes current sense logic and a processor. The current sense logic senses inductor current at a predetermined time point during operation of a constant on-time regulator. The processor determines output current of the constant on-time regulator based on the inductor current sensed at the predetermined time point. The predetermined time point corresponds to half of an on-time period of the constant on-time regulator. The output current may be determined during continuous conduction mode (CCM) or discontinuous conduction mode (DCM). During DCM mode, the processor determines the output current of the constant on-time regulator based on a skip time.

17 Claims, 16 Drawing Sheets

MEASURING CURRENT IN A CONSTANT ON-TIME REGULATOR

TECHNICAL FIELD

Example embodiments disclosed herein relate generally to sensing current in a circuit.

BACKGROUND

A buck regulator is a type of circuit for performing DC voltage conversion. The conversion is performed using a switching circuit that is controlled based on a pulse width modulation (PWM) signal. In operation, the buck regulator controls the duty cycle of the PWM signal to generate a desired output voltage through an LC circuit coupled to a load. The greater the duty cycle, the greater the DC output voltage, and vice versa.

Measuring the output voltage of a buck regulator has proven to be far easier than measuring its output current. One approach for measuring the output current involves using a sense resistor coupled to the capacitor of the LC circuit. The sense resistor increases the cost and complexity of buck regulator and is power inefficient. Also, the sense resistor may increase ripple in the output voltage, which may degrade the transient response of the regulator.

SUMMARY

A brief summary of various example embodiments is presented below. Some simplifications and omissions may be made in the following summary, which is intended to highlight and introduce some aspects of the various example embodiments, but not to limit the scope of the invention. Detailed descriptions of example embodiments adequate to allow those of ordinary skill in the art to make and use the inventive concepts will follow in later sections.

In accordance with one or more embodiments, a current monitor includes current sense logic configured to sense inductor current at a predetermined time point during operation of a constant on-time regulator; and a processor configured to determine output current of the constant on-time regulator based on the inductor current sensed at the predetermined time point, wherein the predetermined time point corresponds to half of an on-time period of the constant on-time regulator. The constant on-time regulator may operate in continuous conduction mode (CCM) and the output current is equal to the inductor current sensed at half the on-time period. A transistor coupled to the inductor of the constant on-time regulator may be switched on during the on-time period to generate the inductor current.

The constant on-time regulator may operate in discontinuous conduction mode (DCM). The processor may determine the output current by calculating an average value of the output current based on the on-time period, an off-time period, and a skip period, and the inductor current sensed at half the on-time period. The current monitor may include at least one timer/counter logic that is configured to (a) determine a number of integer periods that exist during a combined period that includes the on-time period and the off-time period, (b) determine a fraction of an integer period that exists during the combined period, (c) determine a number of integer periods that exist during the skip period, and (d) determine a fraction of the integer period that exists during the skip period, wherein the processor is configured to calculate the average value of the output current based on (a) to (d) and the inductor current sensed at half the on-time period.

The at least one timer/counter logic may determine the fraction of the integer period in (b) by determining a voltage stored in a capacitor during the combined period, the voltage between an initial voltage and a timer voltage that corresponds to full integer period. The at least one timer/counter logic may determine the fraction of the integer period in (d) by determining a voltage stored in a capacitor during the skip period, the voltage between an initial voltage and a timer voltage that corresponds to full integer period. The integer period may be less than the on-time period. The constant on-time regulator may be a buck regulator or a boost regulator.

In accordance with one or other embodiments, a method for monitoring operation of a circuit includes identifying a predetermined time point for a constant on-time regulator, detecting start of an on-time period of the constant on-time regulator, sensing inductor current at the predetermined time point of the on-time period, and determining output current of the constant on-time regulator based on the inductor current sensed at the time point, wherein the predetermined time point corresponds to half the on-time period and the inductor current is sensed at half the on-time period. The constant on-time regulator may operate in continuous conduction mode (CCM) and the output current is equal to the inductor current sensed at half the on-time period. A transistor coupled to the inductor of the constant on-time regulator may be switched on during the on-time period to generate the inductor current.

The constant on-time regulator may operate in discontinuous conduction mode (DCM). Determining the output current may include calculating an average value of the output current based on the on-time period, an off-time period, and a skip period, and the inductor current sensed at half the on-time period. The method may include (a) determining a number of integer periods that exist during a combined period that includes the on-time period and the off-time period, (b) determining a fraction of an integer period that exists during the combined period, (c) determining a number of integer periods that exist during the skip period, (d) determining a fraction of the integer period that exists during the skip period m, and calculating the average value of the output current based on (a) to (d) and the inductor current sensed at half the on-time period.

Determining the fraction of the integer period in (b) may include determining a voltage stored in a capacitor during the combined period, the voltage between an initial voltage and a timer voltage that corresponds to full integer period. Determining the fraction of the integer period in (d) may include determining a voltage stored in a capacitor during the skip period, the voltage between an initial voltage and a timer voltage that corresponds to full integer period. The integer period may be less than the on-time period. The constant on-time regulator may be a buck regulator or a boost regulator.

BRIEF DESCRIPTION OF THE DRAWINGS

Additional objects and features of the invention will be more readily apparent from the following detailed description and appended claims when taken in conjunction with the drawings. Although several example embodiments are illustrated and described, like reference numerals identify like parts in each of the figures, in which:

DETAILED DESCRIPTION

Figure 1:
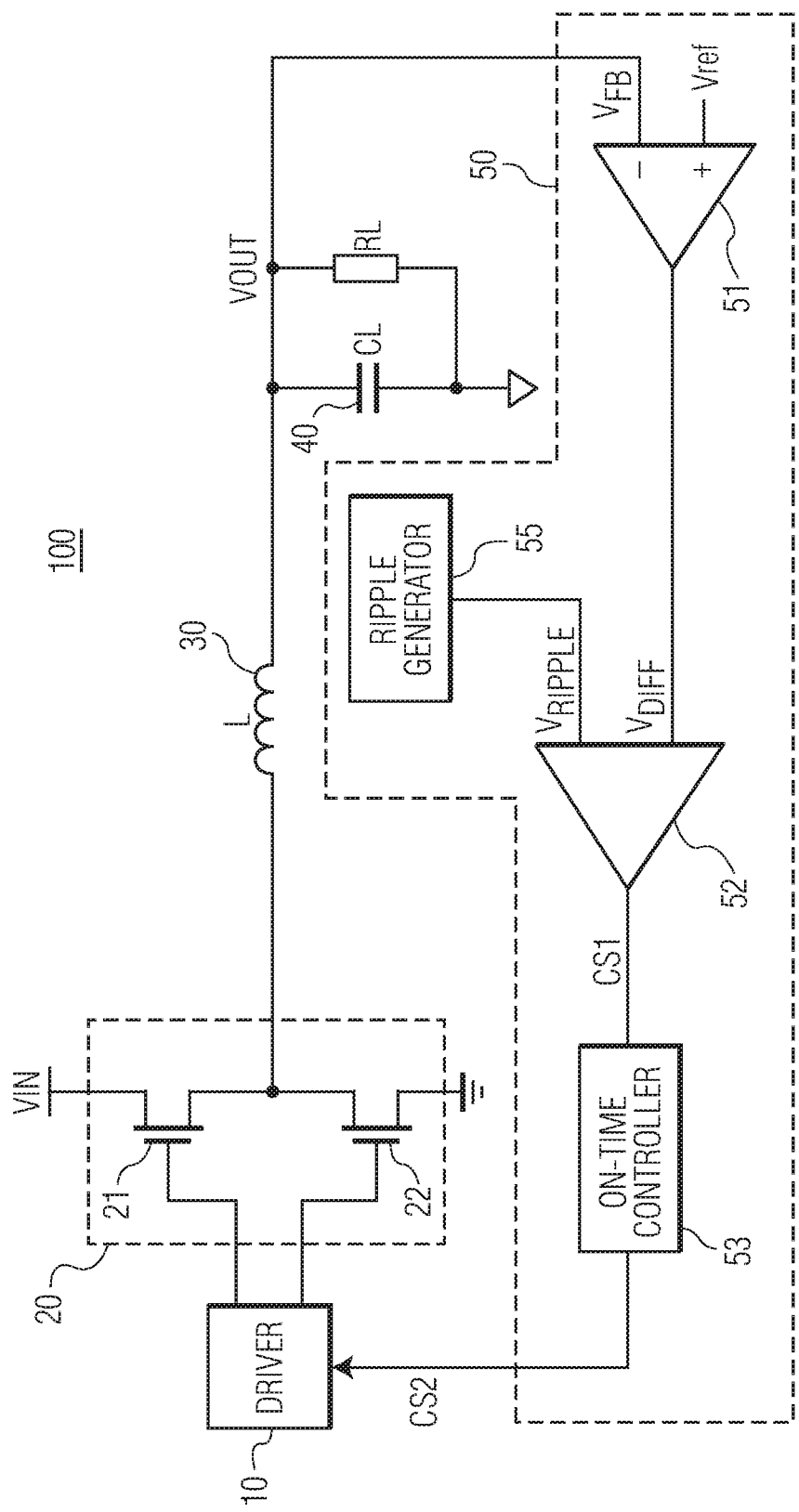
FIG. 1 illustrates an example of a constant on-time buck regulator.

It should be understood that the figures are merely schematic and are not drawn to scale. It should also be understood that the same reference numerals are used throughout the figures to indicate the same or similar parts.

The descriptions and drawings illustrate the principles of various example embodiments. It will thus be appreciated that those skilled in the art will be able to devise various arrangements that, although not explicitly described or shown herein, embody the principles of the invention and are included within its scope. Furthermore, all examples recited herein are principally intended expressly to be for pedagogical purposes to aid the reader in understanding the principles of the invention and the concepts contributed by the inventor(s) to furthering the art and are to be construed as being without limitation to such specifically recited examples and conditions. Additionally, the term, "or," as used herein, refers to a non-exclusive or (i.e., and/or), unless otherwise indicated (e.g., "or else" or "or in the alternative"). Also, the various example embodiments described herein are not necessarily mutually exclusive, as some example embodiments can be combined with one or more other example embodiments to form new example embodiments. Descriptors such as "first," "second," "third," etc., are not meant to limit the order of elements discussed, are used to distinguish one element from the next, and are generally interchangeable. Values such as maximum or minimum may be predetermined and set to different values based on the application.

FIG. 1 illustrates an example of a constant on-time (COT) buck regulator 100 for generating a current for driving a load. The load may differ depending on the intended application. For example, when the load is a battery, the COT buck regulator may generate current for charging the battery using a substantially triangular waveform at a predetermined frequency. In one embodiment, the load may be a microprocessor control unit (MCU) which is driven by current from the COT buck regulator. The load is illustratively shown by resistor $R_L$ in the drawing.

Referring to FIG. 1, the COT buck regulator 100 includes a driver 10, a switching circuit 20, an inductor 30, a capacitor 40, and a feedback circuit 50. The driver 10 generates signals for controlling switches in the switching circuit 20. The driver may perform this function based on a feedback signal from the feedback circuit 50. In one embodiment, the driver 10 may include logic or a dedicated circuit which is responsive to the feedback signal for generating a desired output current waveform with a predetermined frequency. Unlike other types of regulators, the frequency of the output current waveform may be adjusted, for example, based on fluctuations in load or other requirements.

The switching circuit 20 may include a first switch 21 and a second switch 22. The first and second switches may be, for example, MOSFETs having the same conductivity, for example, when the driver 10 outputs separate control signals for the first and second switches. In another embodiment, the MOSFETS may have different conductivities, for example, when the driver 10 outputs a single control signal to control both switches. In this latter case, the first switch 21 (sometimes called the high-side switch or power transistor) may be an PMOS transistor and the second switch 22 (sometimes called the low-side switch or power transistor) may be a NMOS transistor. Because buck regulator 100 is a constant on-time regulator, the driver 10 may output a switching signal to turn on the first switch 21 for a fixed period of time, e.g., the on-time of the first switch 21 is a known and constant time period. The on-time period may be set, for example, based on the intended application, e.g., current requirements of the load. To meet these requirements, driver 10 may generate an output current waveform with a frequency that is adjusted by adjusting the off-time of the duty cycle of the first switch 21 (and proportionally the variable on-time of the second switch 22, which is connected to a reference potential such as ground).

The inductor 30 is coupled between the switching circuit 20 and the load $R_L$, and the capacitor 40 is connected in parallel to the inductor. The capacitor 40 may filter high-frequency (e.g., DC) components of the regulator output prior to being input into the load. The inductor 30 is connected to and disconnected from a supply voltage $V_{IN}$ by switching the first and second switches 21 and 22 to regulate the output voltage $V_{OUT}$ and current $I_{OUT}$ of the voltage regulator.

The switching of transistors 21 and 22 induces a ripple in the inductor current of the voltage regulator. The ripple manifests itself in the output voltage $V_{OUT}$ due, principally, to equivalent series resistance in the output capacitor 40. The ripple in the inductor current constitutes noise which disrupts the stability of or otherwise corrupts the regulator output, which, in turn, may degrade the performance of a circuit driven by the regulator output.

The feedback circuit 50 may be included, in part, to compensate for ripple in the regulator output. The ripple may be compensated by generating a control signal CS2, which, for example, may be a pulse-width modulation (PWM) signal having a fixed on-time and an adjustable off-time. The on-time controls the length of time the first switch 21 is on, which may correspond to the on-time $T_{ON}$ of the duty cycle that controls switching in the switching circuit 20. The off-time controls the length of time the first switch 21 is off, which may correspond to the off-time $T_{OFF}$ of the duty cycle. The second switch 22 is in the off state when the first switch 21 is on and in the on state when the first switch 21 is off. The first and second switches 21 and 22 may therefore be said to be in a half-bridge configuration.

Unlike the on-time of the first switch 21, the off-time of the first switch 21 is adjustable. The feedback circuit 50 adjusts the off-time $T_{OFF}$ in order to reduce ripple in and thus stabilize the output of the voltage regulator. Also, adjusting the off-time of the first switch 21 produces a proportional change in the frequency of the output signal of the regulator.

The feedback circuit 50 may be configured in various ways in order to generate control signal CS2 for the driver 10. In the embodiment of FIG. 1, the feedback circuit 50 includes a comparator 52, an integrator 51, and an on-time controller 53. The integrator 51 compares the output voltage $V_{OUT}$ of the regulator to a reference voltage $V_{REF}$. The reference voltage may be set to a value lower than the ripple valley when in a feedback voltage $V_{FB}$ when first switch 21 is conducting (e.g., during the $T_{ON}$ period). The reference voltage $V_{REF}$ may be ramped up during the off-time $T_{OFF}$ and crosses the feedback voltage $V_{FB}$. The feedback voltage $V_{FB}$ is based on the output voltage $V_{OUT}$ of the regulator, e.g., $V_{FB}$ may equal $V_{OUT}$ or may be a stepped-down version of $V_{OUT}$, as determined, for example, by a voltage divider coupled to the output of the inductor. When rising slope of the feedback voltage $V_{FB}$ crosses the reference voltage $V_{REF}$, the comparator 51 generates an input signal ($V_{DIFF}$) for the integrator 52.

The integrator 52 includes a first input to receive a signal ($V_{RIPPLE}$) from a ripple generator 55 and a second input ($V_{DIFF}$) corresponding to the output of the comparator 51. The signal from the ripple generator 55 may be indicative of the ripple in the output voltage of the regulator, which ripple is proportionally represented in the feedback voltage VFB. The integrator integrates the difference between the ripple voltage VRIPPLE and the output voltage VDIFF of the comparator 51 to generate a control signal CS1 for the on-time controller 53. The on-time controller 53 may be, for example, a one shot multivariable generator.

In operation, when the output voltage VDIFF of the comparator 51 is lower than the difference between the reference voltage VREF and the feedback voltage VFB, the on-time controller 53 outputs a PWM signal CS2 that is high. The driver 10 then generates a first signal to switch power transistor 21 on and a second signal to switch power transistor 22 off as long as the PWM signal CS2 remains high. As a result, the current into the inductor 30 increases and output voltage VOUT of the regulator increases proportionally. The on-time controller 52 maintains the PWM signal CS2 at a high level for a fixed period of time, in order to ensure the constant on-time of the regulator. The feedback circuit 50 then regulates the off-time of power transistor 21 based on changes in the feedback voltage VFB.

Increasing the inductor current and thus the output voltage VOUT of the regulator causes the feedback voltage VFB to increase. When the feedback voltage VFB increases to a point where the output voltage VDIFF of the comparator 51 is greater than the difference between the reference voltage VREF and the feedback voltage VFB, the value of the first control signal CS1 causes the on-time controller 53 to outputs a PWM signal CS2 that is low. The driver 10 then regulates the off time of the first power transistor 21 (and the on time of the second power transistor 22) based on the low value of the PWM signal CS2. This, in turn, causes the inductor current to decrease along with the output of the regulator. When the feedback voltage VFB falls to a point where VDIFF is lower than the difference between the reference voltage VREF and the feedback voltage VFB, the process is repeated.

Figure 2:
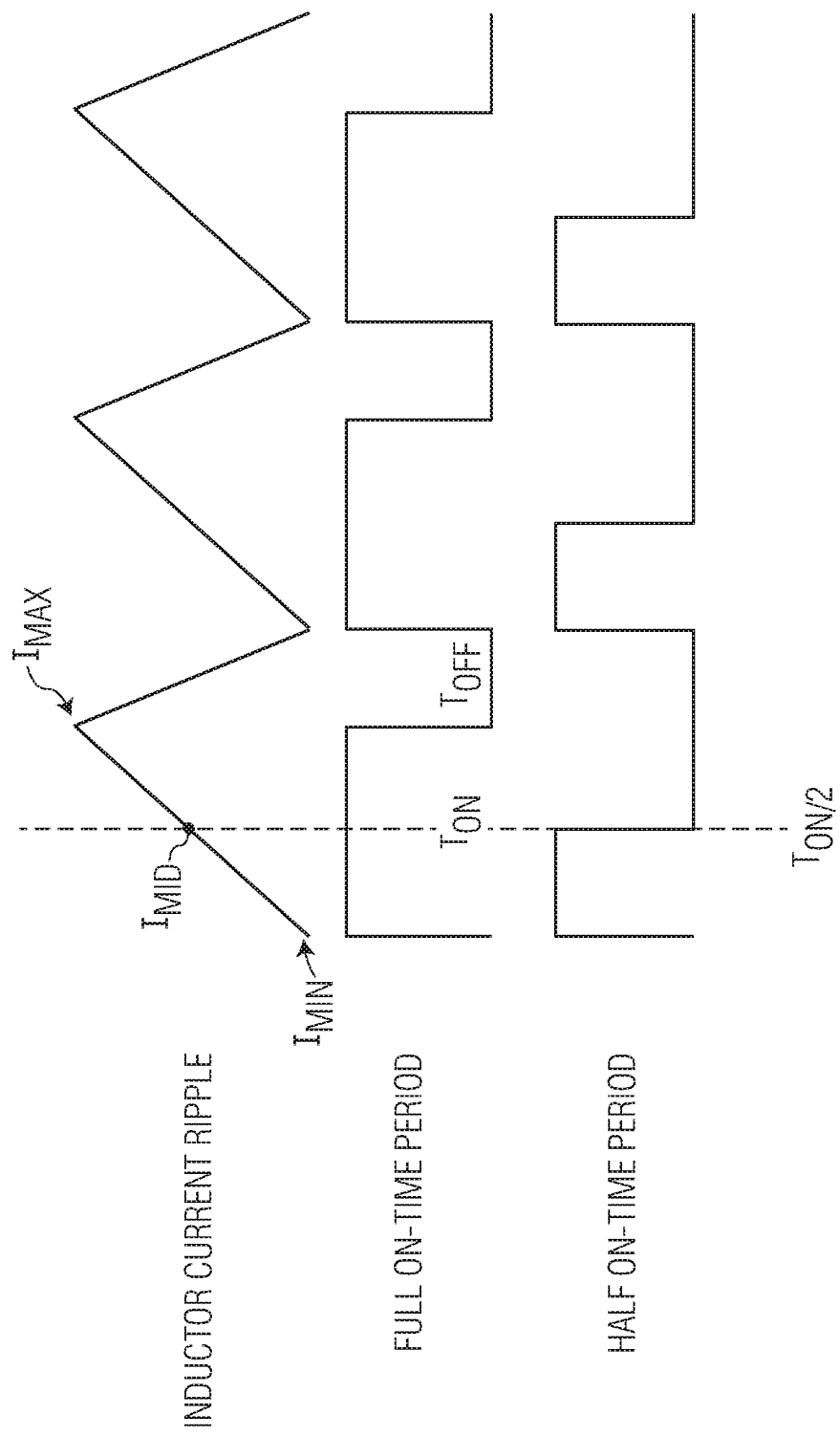
FIG. 2 illustrates waveforms for the constant on-time buck regulator.

FIG. 2 illustrates an embodiment of waveforms generated in and by the COT buck regulator of FIG. 1 when operating in continuous conduction mode (CCM). In CCM mode, voltage gain is not dependent on the load, the input current is continuous and not pulsating, and the ripple component of the inductor current is lower than the average of the inductor current. As a result, a regulator operating in CCM mode may be more efficient than other modes for at least some applications. The waveforms in FIG. 2 may form the basis for understanding one embodiment of a method for sensing current in the COT buck regulator in CCM mode.

Referring to FIG. 2, the method relies on the fixed on-time of the buck regulator 100 in order to sense the current input into the inductor 30. More specifically, as is the case with a COT buck regulator, the full on-time waveform in FIG. 2 has an on-time period $T_{ON}$ which corresponds to the constant on-time of the power transistor 21 in the switching circuit. (In this sense, the on-time of the COT buck regulator may be said to be feedforward controlled). The constant on-time period $T_{ON}$ produces an increase in current into the inductor 30, as represented by the rising portion of the inductor current ripple waveform. When the constant (or full) on-time period $T_{ON}$ expires, the power transistor 21 is turned off for an off-time period $T_{OFF}$. This decreases the current into the inductor 30, as represented by the falling portion of the inductor current ripple waveform. (Because the COT buck regulator is operating in CCM mode in this embodiment, the triangular waveform of the inductor ripple current does not include a skip time).

Because the full on-time period $T_{ON}$ of the power transistor 21 is a known fixed constant value, the half point of the full on-time period (e.g., $T_{ON}/2$) is also a known fixed constant value and corresponds to the half on-time period in FIG. 2. Because the current into the inductor 30 rises linearly (or at least substantially so) when the power transistor 21 is on, the end point of the half on-time period corresponds to the mid-point of the inductor ripple current $I_{MID}$, as shown by the dotted line. The mid-point of the inductor ripple current is equal to the average current of the inductor current. Thus, the current of the COT buck regulator may be determined based on the half on-time period of the power transistor 21.

Figure 3:
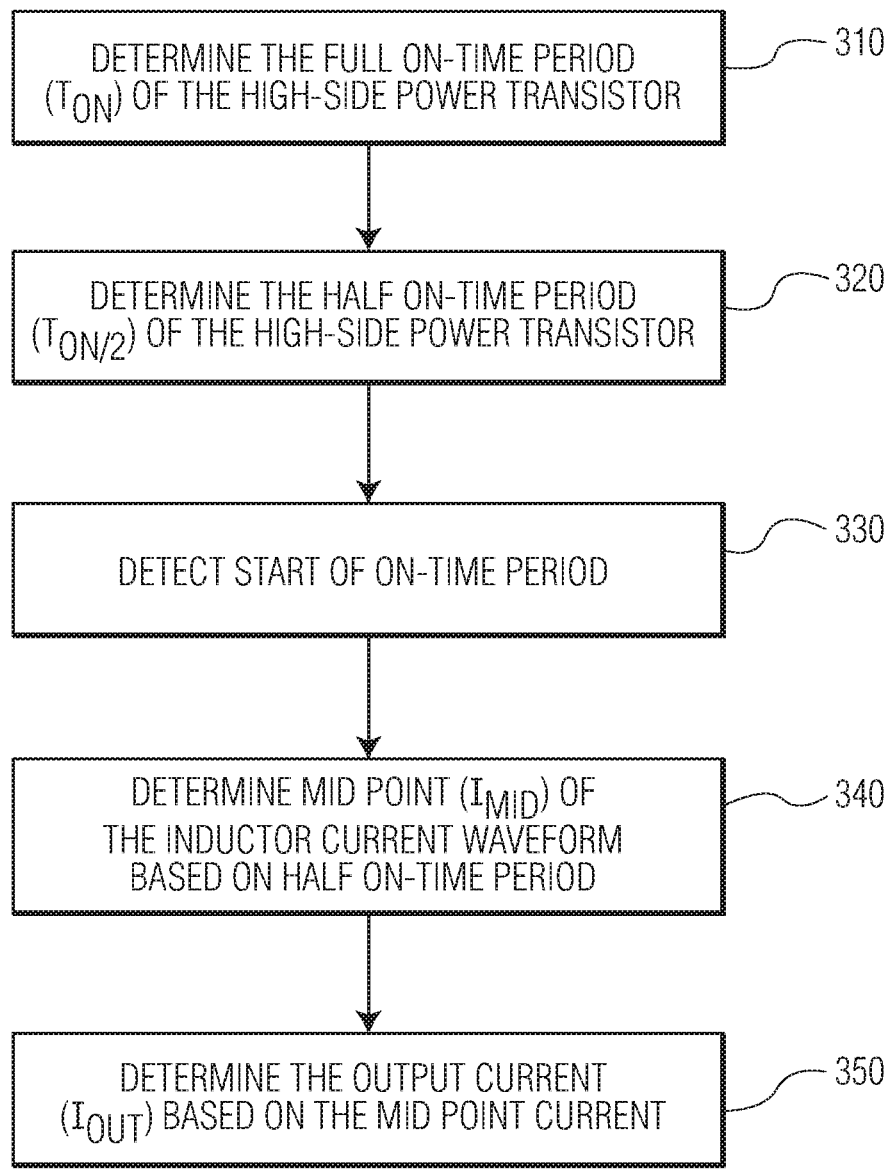
FIG. 3 illustrates an embodiment of a method for determining output current of the regulator operating in continuous conductor mode (CCM)

FIG. 3 illustrates an embodiment of a method for sensing current in the COT buck regulator 100 based on the waveforms in FIG. 2. At 310, the method includes determining the full on-time period ($T_{ON}$) of the power transistor 21 that controls current to the inductor 30. As previously indicated, the $T_{ON}$ period is a known constant value determined, for example, based on the intended application of the regulator, e.g., load requirements. At 320, the half on-time period ($T_{ON}/2$) is identified based on the full on-time period. At 330, start of the on-time period is detected, for example, based on a non-zero inductor current. At 340, the point ($I_{MID}$) on the inductor current ripple waveform is determined that corresponds to the termination point of the half on-time period ($T_{ON}/2$). At 350, the output current of the COT buck regulator is determined based on the current $I_{MID}$ in FIG. 2.

In one embodiment, this output current may be considered to be the average output current (e.g., $I_{OUT}$) of the COT buck regulator, e.g., $I_{OUT}=I_{MID}$.

Figure 4:
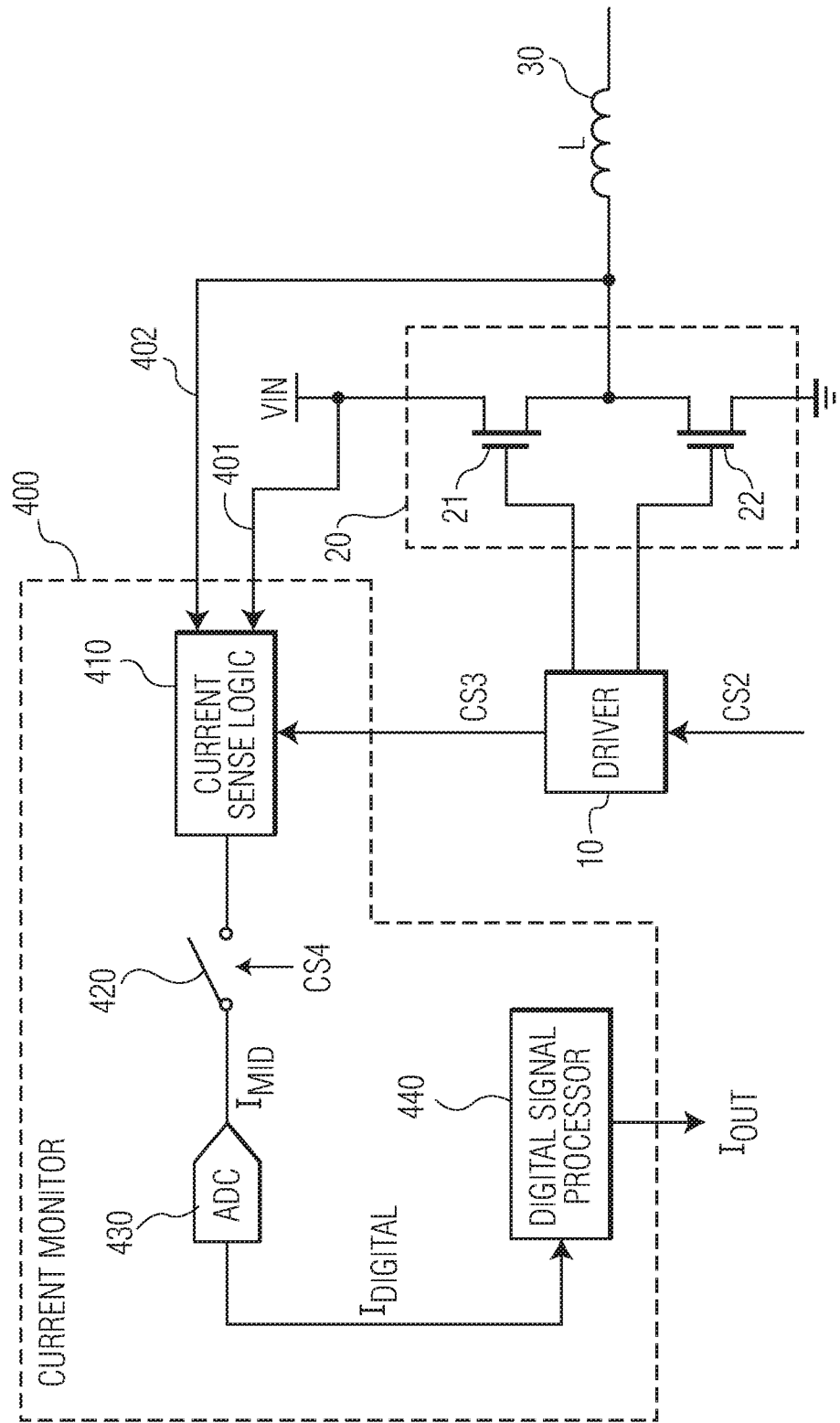
FIG. 4 illustrates an embodiment of a current monitor CCM mode operation.

FIG. 4 illustrates an embodiment of a current monitor 400 to determine the output current $I_{OUT}$ of a COT buck regulator. The regulator may include a half-bridge switching circuit such as in the regulator 100 of FIGS. 1 and 2 or the regulator may be a different COT buck regulator or even a COT boost regulator.

Referring to FIG. 4, the current monitor 400 includes current sense logic 410, a switch 420, an analog-to-digital converter 430, and a digital signal processor 440 for outputting information indicative of the output current of the regulator. The current sense logic 410 measures the current flowing at a predetermined point of the buck regulator continuously or when the power transistor 21 is on. For example, the current sense logic 410 may measure the current output from the power transistor 21 during a time when transistor 21 is on based on input signals 401 and 402 (e.g., when one or more of these input signals has a non-zero value) and a control signal CS3 output from driver 10. Input signals 401 and 402 may correspond to the source and drain voltages, respectively of the high side switch. The control signal CS3 may enable the current sense logic when the high-side power transistor 21 is turned on and disable the current sense logic when power transistor 21 is turned off, in cases where the current sense logic does not operate on a continuous basis. The sensed current may correspond to the inductor current ripple waveform illustrated in FIG. 2. In one embodiment, a controller may generate the control signal CS3 and/or control signal CS4 mentioned below.

The switch 420 may control when the sensed current output from current sense logic 410 is sampled. The state of switch 420 may be determined based on a control signal CS4, which, for example, may be asserted at a time coincident with the termination point of the half on-time period $T_{ON}/2$ in FIG. 2. Because the buck regulator is a constant on-time regulator, the half on-time period $T_{ON}/2$ is a fixed constant period that is known, for example, based on the designers of the buck regulator and/or otherwise determinable based on the requirements of the circuit driven by the regulator output. The control signal CS4 may cause the switch 420 to close at the beginning of the half on-time period TON/2 and open of the half on-time period TON/2. The point in time when the switch opens (e.g., at the termination point of the half on-time period) corresponds to the current IMID in FIG. 2, which may be equal or used as a basis for determining the mid-point current IMID, which, in turn, provides an indication of the average output (ripple) inductor current IOUT.

The current value(s) output during the time when the switch 420 is closed, or at the mid-point of the current IMID, may be converted to a digital current value IDIGITAL by the analog-to-digital converter 430. This digital current value IDIGITAL may be processed by the digital signal processor 440 to generate an indication of the monitored output current IOUT of the COT buck regulator. In one embodiment, the digital signal processor 440 may perform an extrapolation algorithm to generate the indication of monitored output current (e.g., average output current) IOUT. The digital signal processor 440 may perform various types of processing. Examples include averaging the readback current in certain period or writing the data to the internal memory in order for the system to be able to get the history data. In one embodiment, no digital signal processing is performed. In this case, the real time raw data may be stored and updated every reading cycle.

In one embodiment, the current sense logic 410 may include a capacitor which is charged based on the current sensed by one or more of input signals 401 and 402. Charging and discharging the current in such a capacitor increases and decreases the voltage stored in the capacitor. The increasing and decreasing capacitor voltage may provide a proportional indication of inductor current. In another embodiment, the current sense logic may include software driven by instructions stored in a memory. The full on-time period ($T_{ON}$), and thus the half on-time period $T_{ON}/2$, may be programmed into a memory or database for use or access by these instructions. The instructions may therefore cause a processor (or other processing logic) to determine the current $I_{MID}$ that exists at the end of the half on-time period $T_{ON}/2$ in the manner indicated by the dotted line in FIG. 2.

Figure 5:
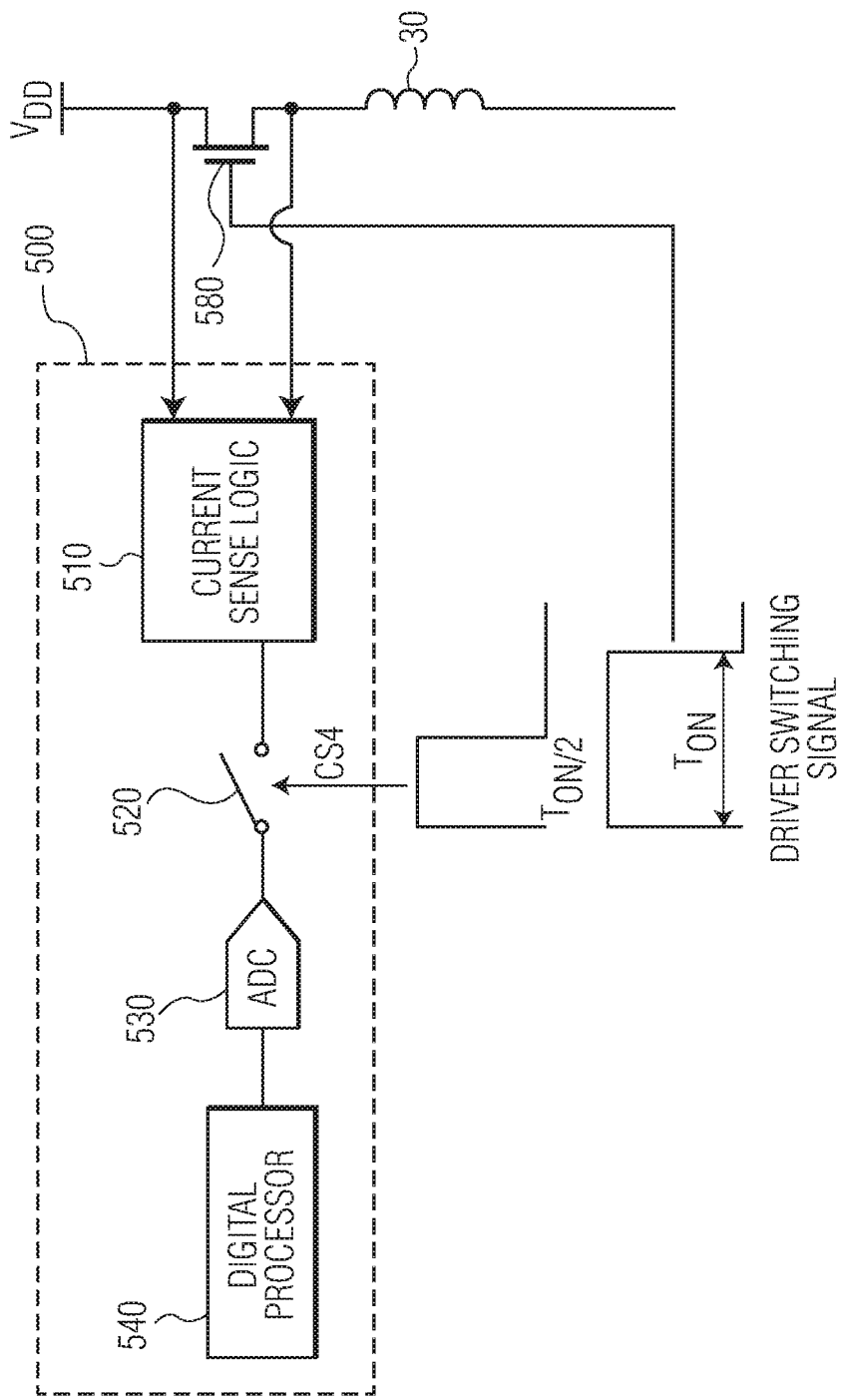
FIG. 5 illustrates another embodiment of a current monitor for CCM mode operation.

FIG. 5 illustrates another embodiment of a monitor 500 to sense the current of a COT buck regulator. In this embodiment, the half-bridge switching circuit is replaced with a single switch (transistor) 580 coupled to the inductor 30. Otherwise, the monitor 500 may function in a manner similar to the monitor of FIG. 4. For example, the switch 520 closes at the beginning of the on-time period $T_{ON}$ and opens at the half on-time period $T_{ON}/2$, or may close at a time coincident with the half on-time period $T_{ON}/2$, to sample the current measured by the current sense logic 510 at the mid-point $I_{MID}$ of the output ripple current in FIG. 2. The analog-to-digital converter 530 converts the mid-point current $I_{MID}$ to a digital signal, which is then processed by digital signal processor 540 to generate an indication of the output current $I_{OUT}$ of the COT buck regulator.

Figure 6A:
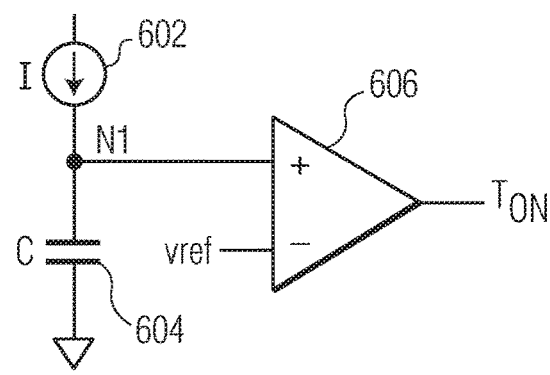
FIGS. 6A and 6B illustrate embodiments of signal generators and FIG. 6C illustrates an example of waveforms generated by the signal generators of FIGS. 6A and 6B.
Figure 6B:
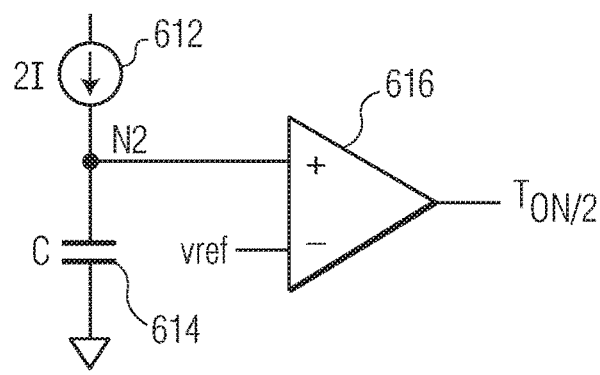

FIGS. 6A and 6B illustrate embodiments of signal generators for generating control signals for respective ones of the embodiments of FIGS. 4 and 5. Referring to FIG. 6A, the signal generator includes a current source 602, a capacitor 604, and a comparator 606. The current source 602 is coupled to the capacitor 604 through a node N1. The non-inverting terminal of the comparator 604 is coupled to the node N1 and the inverting terminal of the comparator 604 is coupled to a reference voltage $V_{REF}$, which may or may not be the same as the reference voltage input into the non-inverter terminal of comparator 51 in FIG. 1.

Referring to FIG. 6B, the signal generator includes a current source 612, a capacitor 614, and a comparator 616. The current source 612 is coupled to the capacitor 614 through a node N2. The non-inverting terminal of the comparator 614 is coupled to the node N2 and the inverting terminal of the comparator 614 is coupled to the reference voltage $V_{REF}$, which may or may not be the same as the reference voltage input into the non-inverter terminal of comparator 51 in FIG. 1.

Figure 6C:
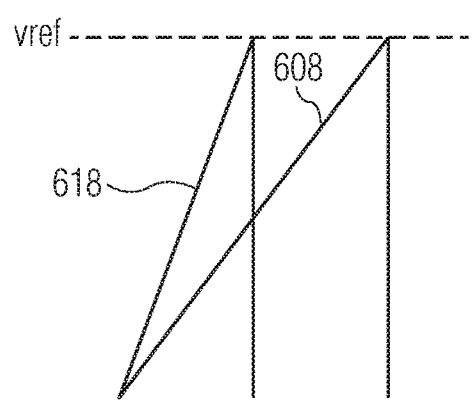

In FIGS. 6A and 6B, the capacitors 602 and 612 may have the same capacitance C and the current (2I) output from current source 612 may be twice the current (I) output from the current source 602. When the ramp signal generated I/C becomes greater than the reference voltage, the $T_{ON}$ time is generated. In this embodiment, comparator 614 outputs a ramp signal 618 with half period ($T_{ON}/2$) and comparator 604 may output ramp signal 608 with full period ($T_{ON}$) for respectively controlling switch 420 and transistor 21 in FIG. 4 and switch 520 and transistor 680 in FIG. 5, as illustrated in FIG. 6C. The value of $T_{ON}$ may be calculated, for example, based on Equation (1).

$$T_{ON} = \frac{C * V_{ref}}{I} \tag{1}$$

Figure 7A:
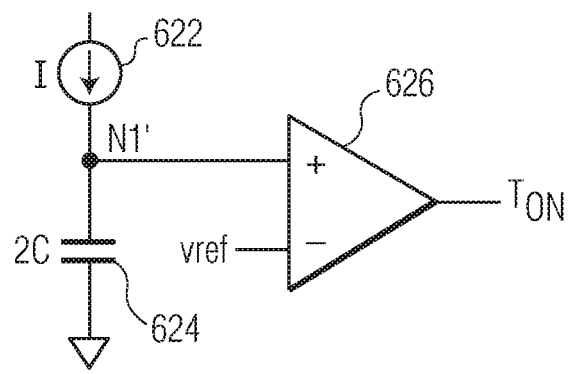
FIGS. 7A and 7B illustrate additional embodiments of signal generators.
Figure 7B:
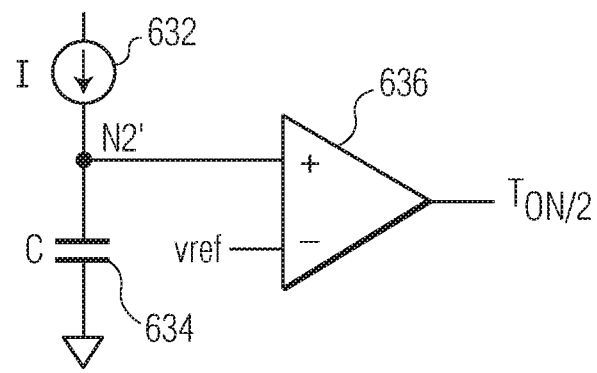

FIGS. 7A and 7B illustrate additional embodiments of signal generators for respectively generating control signals for the embodiments of FIGS. 4 and 5. Referring to FIG. 7A, the signal generator includes a current source 622, a capacitor 624, and a comparator 626. The current source 622 is coupled to the capacitor 624 through a node N1'. The non-inverting terminal of the comparator 624 is coupled to the node N1' and the inverting terminal of the comparator 624 is coupled to a reference voltage $V_{REF}$, which may or may not be the same as the reference voltage input into the non-inverter terminal of comparator 51 in FIG. 1.

Referring to FIG. 7B, the signal generator includes a current source 632, a capacitor 634, and a comparator 636. The current source 632 is coupled to the capacitor 634 through a node N2'. The non-inverting terminal of the comparator 634 is coupled to the node N2' and the inverting terminal of the comparator 634 is coupled to the reference voltage $V_{REF}$, which may or may not be the same as the reference voltage input into the non-inverter terminal of comparator 51 in FIG. 1.

In the embodiments of FIGS. 7A and 7B, the capacitor 624 has a capacitance (2C) that is twice the capacitance (C) of capacitor 634 and the current sources 622 and 632 output the same current (I). As a result, the comparator 624 may output a ramp signal with half period ($T_{ON}/2$) and comparator 634 may output ramp signal with full period ($T_{ON}$) for respectively controlling switch 420 and transistor 21 in FIG. 4 and switch 520 and transistor 680 in FIG. 5, as illustrated in FIG. 6C.

Figure 8A:
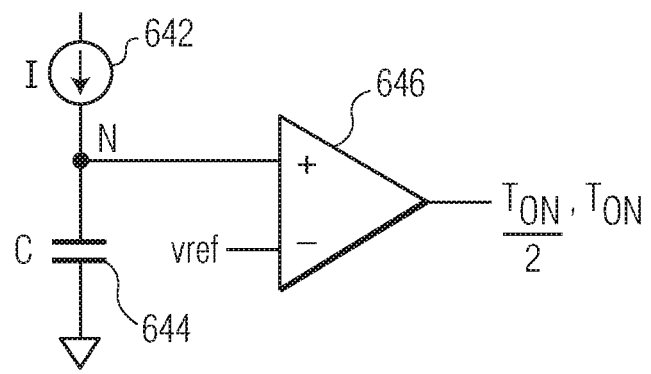
FIG. 8A illustrates an additional embodiment of a signal generator and FIG. 8B illustrates an example of waveforms generated by the signal generator of FIG. 8B.
Figure 8B:
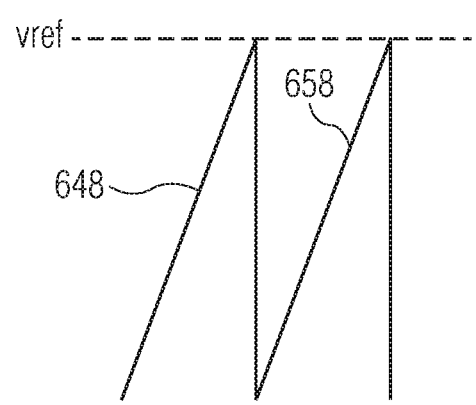

FIG. 8A illustrates an additional embodiment of a signal generator for generating control signals for the embodiments of FIGS. 4 and 5. Referring to FIG. 8A, the signal generator includes a current source 642, a capacitor 644, and a comparator 646. The current source 642 is coupled to the capacitor 644 through a node N. The non-inverting terminal of the comparator 646 is coupled to the node N and the inverting terminal of the comparator 644 is coupled to a reference voltage $V_{REF}$, which may or may not be the same as the reference voltage input into the non-inverter terminal of comparator 51 in FIG. 1. The current source 642 outputs a current (I) and the capacitor 644 has a capacitance C. In operation, the comparator 646 outputs consecutive ramp signals, each with a period of $T_{ON}/2$. Thus, the first ramp signal 648 may control switch 420 in FIG. 4 and switch 520 in FIG. 5 and the second ramp signal 658 may control transistor 21 in FIG. 4 and transistor 680 in FIG. 5, as illustrated in FIG. 8B.

Figure 9:
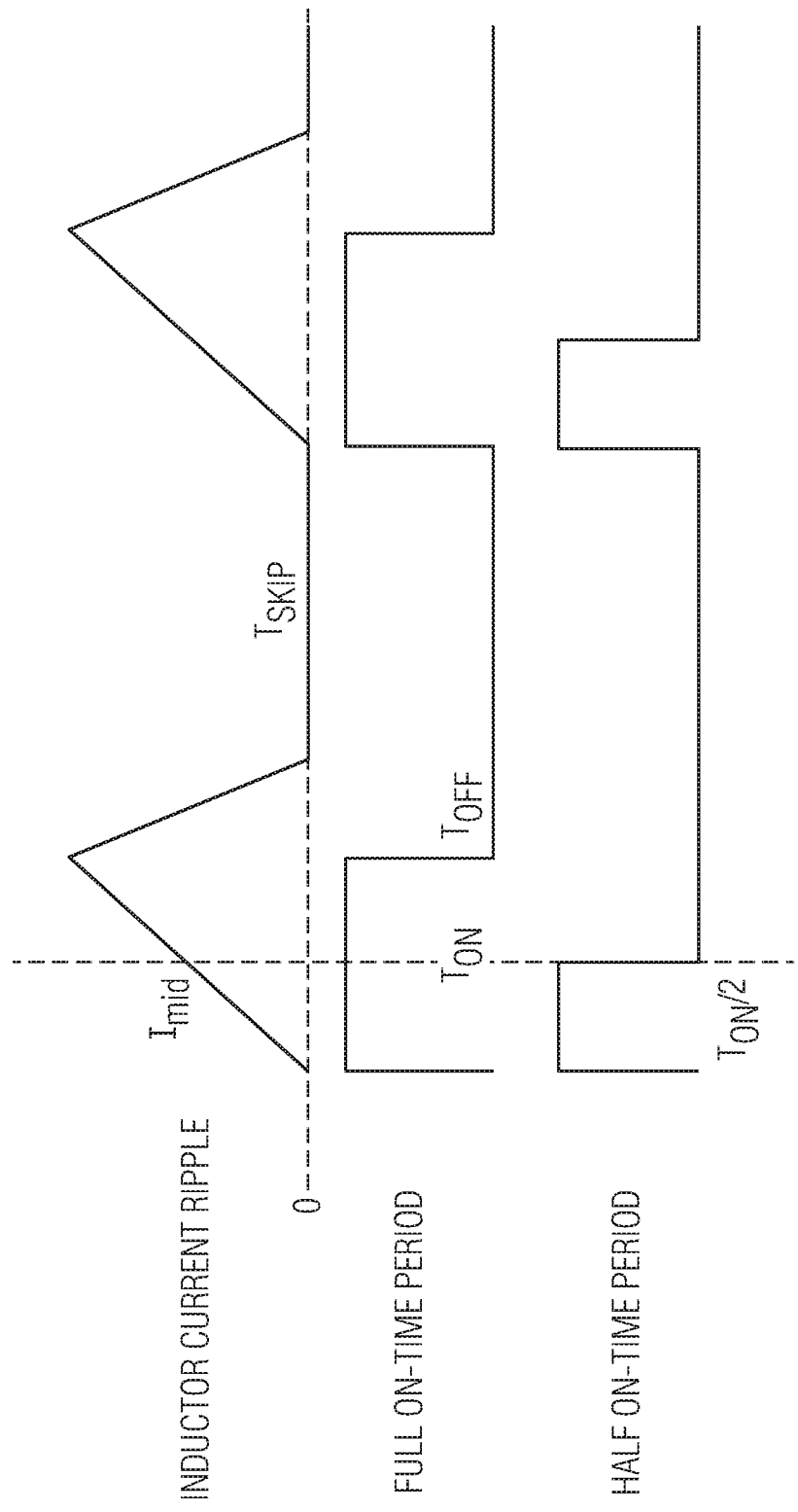
FIG. 9 illustrates an embodiment of waveforms generated during discontinuous conduction mode (DCM) operation.

FIG. 9 illustrates an embodiment of waveforms generated in and by the COT buck regulator of FIG. 1 when operating in discontinuous conduction mode (DCM), which may be referred to as skip mode. In DCM mode, voltage gain is dependent on the load, the input current is pulsating, and the ripple component of the inductor current is higher and its root-mean-square (RMS) value is higher than in CCM mode. The waveforms in FIG. 2 may also be generated by the current monitor in FIG. 1 or may be generated by a different circuit. These waveforms may form the basis for understanding one embodiment of a method for sensing current in the COT buck regulator in DCM mode.

The COT buck regulator of FIG. 1 may be driven in DCM mode to improve efficiency at low-load current cases. During the inductor current discharging phase, when the inductor current becomes zero (e.g., at zero crossing), the low-side switch 22 is turned off. As a result, both the high-side switch 21 and the low-side switch 22 remain in an off state until the output voltage monitoring loop detects another charging pulse is to be generated. The waveforms in FIG. 9 are thus generated.

Referring to FIG. 9, the waveforms in DCM mode may be similar to those generated in CCM mode, except that the inductor current ripple waveform includes a discontinuous series of triangular waveforms separated by a period of time $T_{SKIP}$. The $T_{SKIP}$ period causes the off-time $T_{OFF}$ of switch 21 to be much longer compared to the off-time of this switch in CCM mode, as illustrated in FIG. 2. The spacing between the half on-time waveforms is also increased based on the $T_{SKIP}$ period.

Figure 10:
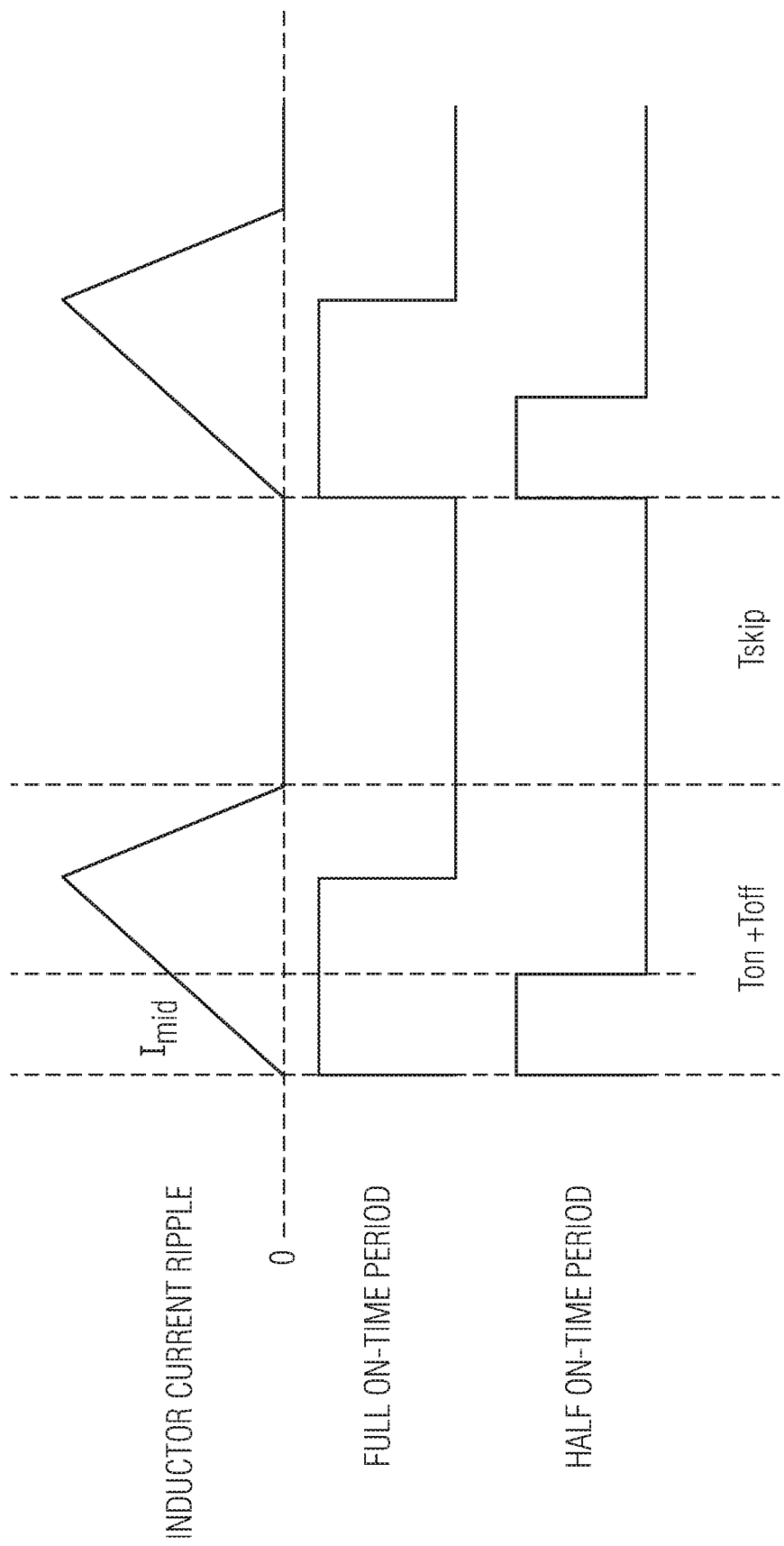
FIG. 10 illustrates different periods that may be included for the waveforms in FIG. 9.

When the COT buck regulator operates in DCM mode, the sensed inductor current mid-point $I_{MID}$ does not directly represent the average output current of the regulator because of the $T_{SKIP}$ period. Instead, the average output current may be determined based on the total charges transferred to the output divided by the total period $T_{TOTAL}=T_{ON}+T_{OFF}+T_{SKIP}$, as expressed in Equation (2). These times are plotted against the waveforms of FIG. 9 in the example of FIG. 10.

$$I_{OUT} = \frac{I_{mid} * (T_{ON} + T_{OFF})}{T_{ON} + T_{OFF} + T_{SKIP}} \quad (2)$$

The $T_{ON}$ period, the $T_{OFF}$ period, and the $T_{SKIP}$ period in DCM mode may be determined in a variety of ways. Example embodiments for determining these periods are discussed below. Once the $T_{ON}$ period is determined, the inductor current mid-point $I_{MID}$ may be calculated by a processor or other logic coupled to the COT buck regulator based on Equation (2). (It is also noted that Equation (2) may be used for determining the output current in the CCM mode, e.g., in CCM mode $T_{SKIP}=0$ in which case $I_{OUT}=I_{MID}$, as previously discussed.)

Figure 11:
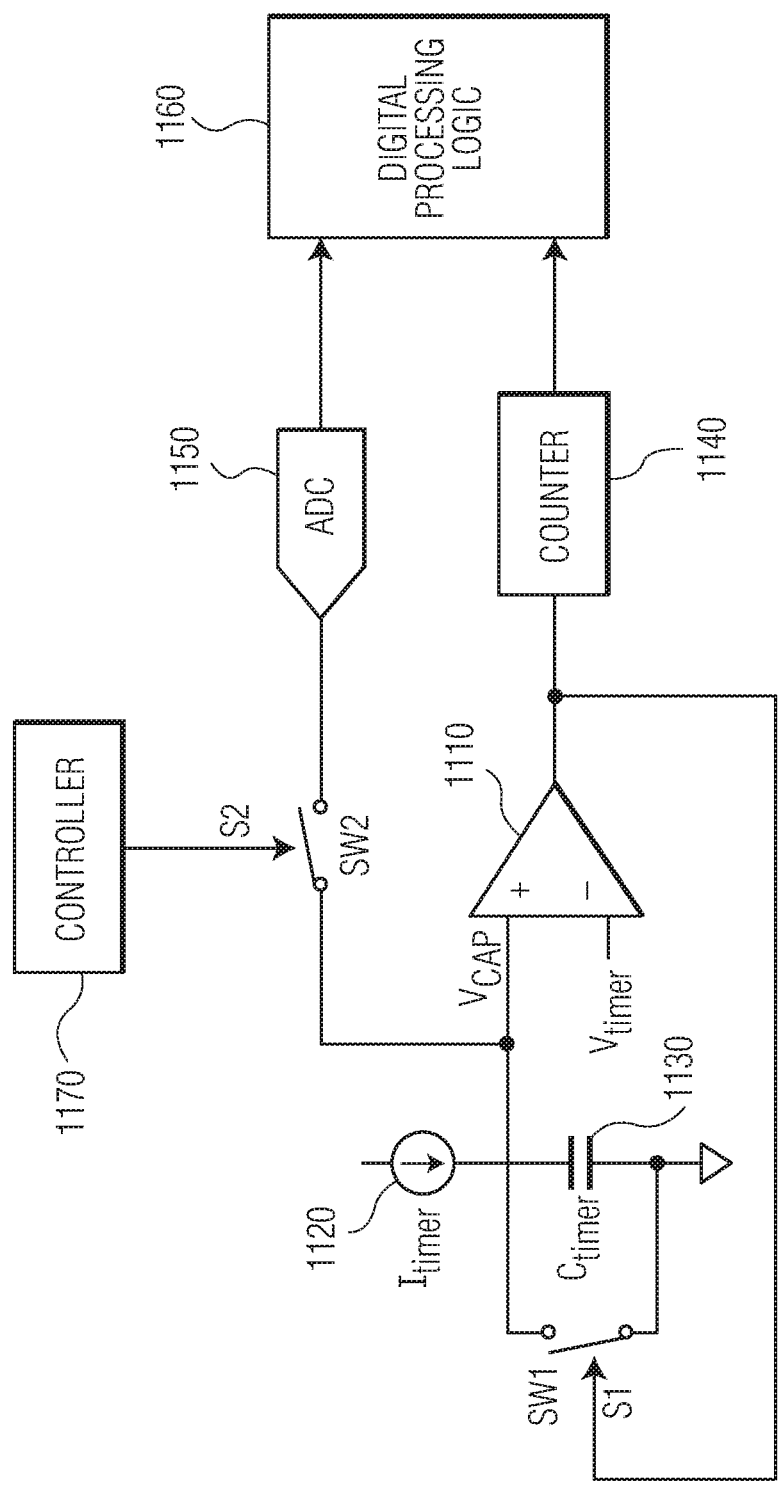
FIG. 11 illustrates an embodiment of counter/timer logic.

FIG. 11 illustrates an embodiment of asynchronous timer/counter logic that may be used to determining the periods for calculating the output current $I_{OUT}$ of the COT buck regulator in DCM mode using Equation (2). The COT buck regulator may be, for example, the one illustrated in FIG. 1 or may be a COT buck regulator having a different structure. For convenience of illustration, the COT buck regulator of FIG. 1 will be discussed in this case.

The asynchronous timer/counter logic counts a number of predetermined periods T for purposes of determining two periods of time in Equation (2). The first period of the two periods corresponds to the combined period ($T_{ON}+T_{OFF}$) and the second period of the two periods corresponds to the $T_{SKIP}$ period. In one embodiment, the period T may be less than each of the $T_{ON}$ period, the $T_{OFF}$ period, and the $T_{SKIP}$ period in order to allow for the computation of fractional integer periods that may occur during operation of the COT buck regulator in DCM mode. This will become more apparent with reference to FIG. 12 discussed below. In one embodiment, the predetermined period T may be greater than at least one of the combined period or skip period mentioned above.

Referring to FIG. 11, the asynchronous timer/counter logic includes a comparator 1110, a timer current source 1120, a capacitor 1130, a counter 1140, an analog-to-digital converter 1150, and digital processing logic 1160. The comparator 1110 continuously compares the charging voltage stored in capacitor 1130 to a reference voltage $V_{timer}$. The capacitor 1130 is charged at a predetermined rate based on the magnitude of the charging current $I_{timer}$ from current source 1120. The value of the charging current $I_{timer}$ and the capacitance $C_{timer}$ of capacitor 1130 may be predetermined to set the length of time of time period T.

In operation, switch SW1 is closed when the output signal S1 of the comparator is a logical zero, indicating that the capacitor voltage $C_{charge}$ is less than the reference voltage $V_{timer}$. When switch SW1 is closed, the current source 1120 may be controlled to begin outputting current $I_{timer}$ to the capacitor 1130. (In one embodiment, a controller 1170 may control output of current from the current source 1120 and/or the state of switch SW1, at least initially). When the current $I_{timer}$ begins charging the capacitor 1130, the charging voltage $V_{CAP}$ of the capacitor 1130 is input into the comparator 1110 through capacitive coupling.

Figure 12A:
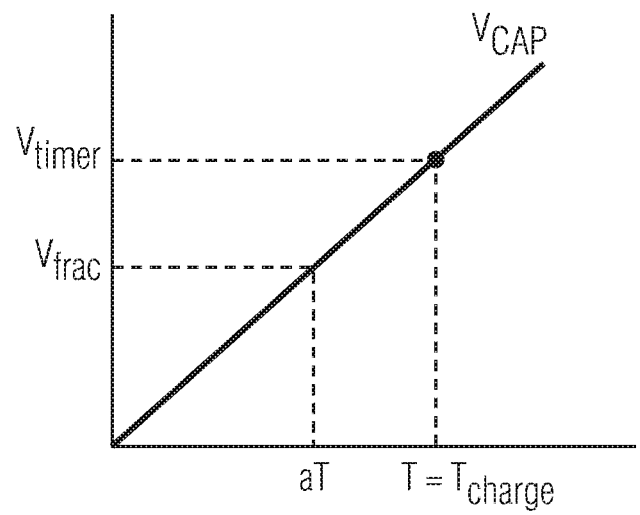
FIGS. 12A and 12B illustrates an example of waveforms generated by the counter/timer logic of FIG. 11.

The period of time it takes for capacitor 1130 to charge to a voltage equal to reference voltage $V_{timer}$ constitutes the period T. An example is illustrated in FIG. 12A, where the charging time $T_{charge}$ required for $V_{CAP}=V_{timer}$ equals one time period T. When $V_{CAP}=V_{timer}$, the comparator 1110 outputs signal S1 with a logical one value to the counter 1140, which increments by one to denote that one period T has been counted. The value of T may be determined based on Equation (3).

$$T = \frac{C_{timer} * V_{timer}}{I_{timer}} \quad (3)$$

The logical one value of signal S1 opens switch SW1, which allows the voltage stored in capacitor 1130 to discharge through a ground connection. When the capacitor voltage drops to zero, the switch SW1 closes again and the capacitor begins to recharge.

The inductor current may be monitored at this time. When the inductor current reaches a zero crossing, this indicates that the combined period ($T_{ON}+T_{OFF}$) has expired. At this time, the controller 1170 generates signal S2 to close switch SW2. Closing switch SW2 samples the capacitor voltage $V_{CAP}$ at this time. If $V_{CAP}=0$ when switch SW2 is closed, then an integer number of time periods T have been counted with no fractional periods. Thus, the analog-to-digital converter 1150 will output a signal to the digital processing logic 1160 indicating that no fractional periods were counted, e.g., a=0. The integer number of time periods that were counted will be indicated in the output of counter 1140. The digital processing logic 1160 then compute the combined value of ($T_{ON}+T_{OFF}$) based on the integer number of periods T that were counted.

If $V_{CAP} \neq 0$ at the time switch SW2 closed (e.g., at the time of zero crossing of the inductor current), then $0<V_{CAP}<V_{timer}$, where 0 is an initial voltage. In this case, the analog-to-digital converter 1150 converts the capacitor voltage $V_{CAP}$ to a number (a) corresponding to a fractional part of period T, e.g., aT. This conversion is possible because the fractional value of $V_{CAP}$ at this time ($V_{FRAC}$) corresponds to a proportional fractional value of T, as illustrated, for example, in FIG. 12A. The initial voltage may be different from 0 (e.g., a small voltage or some voltage limit) in another embodiment.

Figure 12B:
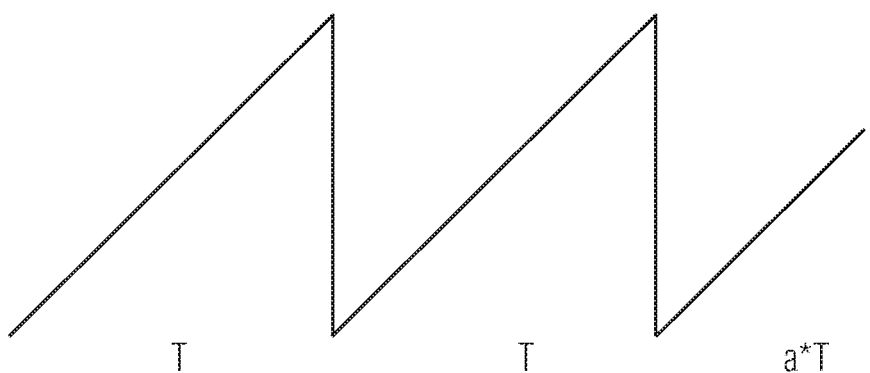

FIG. 12B illustrates an example of where the asynchronous timer/counter logic counted 2 full periods (counter value=2) and a fractional period a*T (fraction=a) during the combined ($T_{ON}+T_{OFF}$) period. As previously indicated, the starting point of this combined period may correspond to a first zero crossing of the inductor current and the ending point of this period may correspond to a second zero crossing of the inductor current. The controller 1170 may monitor these zero crossings to generate signal S1 for closing switch SW1 and to close switch SW2, as previously indicated. Once inductor current begins to increase again after the second zero crossing value, the controller 1170 may change the value of signal S2 to open switch SW2 and the process is repeated.

The asynchronous timer/counter logic of FIG. 11 may be implemented in various ways to determine the output current of the COT buck regulator operating in DCM mode. As previously indicated relative to FIGS. 12A and 12B, the number of periods T in the combined ($T_{ON}+T_{OFF}$) period may not be an integer number alone, i.e., in some cases there may be a fractional part of a period T in addition to an integer number of T periods. The same may be true in the $T_{SKIP}$ period.

In one embodiment, the same asynchronous timer/counter logic may be used to determine the fractional T values in both the combined ($T_{ON}+T_{OFF}$) and $T_{SKIP}$ periods. In another embodiment, different asynchronous timer/counter logic (e.g., as illustrated in FIG. 11) may be used, one to determine the number of integer periods T and a fractional period in the combined ($T_{ON}+T_{OFF}$) period and another one to determine the integer periods T and a fractional period in the $T_{SKIP}$ period.

Figure 13:
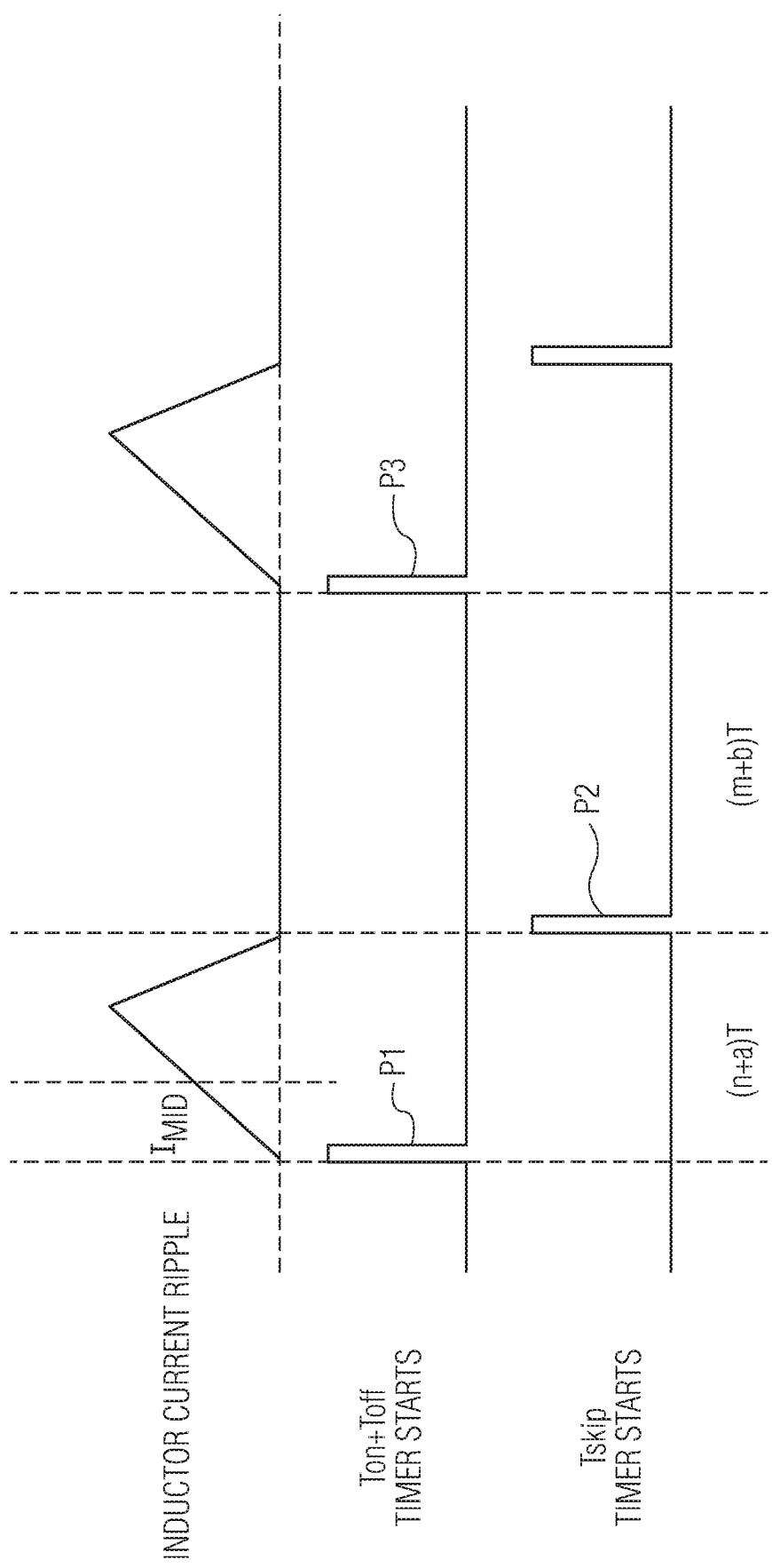
FIG. 13 illustrates an embodiment of timer initiation signals for counter/timer logic.

FIG. 13 illustrates an example of a timing diagram for generating the output current of the COT buck regulator using either one asynchronous timer/counter logic or separate asynchronous timer/counter logic, as indicated above. When only one asynchronous timer/counter logic is used, the controller 1170 may be programmed to monitor three zero crossings of the inductor current ripple.

The first zero crossing may correspond to the time when driver 10 (in FIG. 1) generates a control signal to turn on switch 21. When this occurs, the controller 1170 may generate a first pulse signal P1, which, for example, may correspond to signal S1 that closes switch SW1 (see FIG. 11) at the beginning of the combined ($T_{ON}+T_{OFF}$) period. As a result, the inductor current ripple begins to increase with a predetermined slope proportional to a current generated by the supply voltage $V_{IN}$. Simultaneously, the counter 1140 begins counting integer numbers of intervals T during this time.

The second zero crossing may correspond to the time when the inductor current reaches zero at the end of the combined ($T_{ON}+T_{OFF}$) period. When this occurs, controller 1170 may generate a second control signal S2 to close switch SW2 (see FIG. 11). As a result, the analog-to-digital converter 1150 determines the fractional period aT that existed at the end of the combined period (if any). The digital processing logic 1160 receives the fractional period value a from the analog-to-digital converter 1150 and the final integer count n periods T from the counter 1140. Also, when the second zero crossing is detected, the controller 1170 may generate a second pulse signal P2 to start the beginning of the $T_{SKIP}$ period. The same asynchronous timer/counter may be used in the $T_{SKIP}$ period because the capacitor 1130 (see FIG. 11) has been discharged and thus reset to zero.

The third zero crossing may correspond to the beginning of the next combined ($T_{ON}+T_{OFF}$) period, which may be detected, for example, when the inductor current ripple begins to rise again. The beginning of the next combined ($T_{ON}+T_{OFF}$) period coincides with the end of the $T_{SKIP}$ period. At this time, the controller 1170 may generate a third pulse signal P3, which once again closes switch SW2 to allow the analog-to-digital converter 1150 to input a value (based on the stored capacitor voltage) corresponding to the fractional period during the $T_{SKIP}$ period (if any). This fractional period may be denoted by bT and is determined by the digital processing logic 1160 based on the output of the converter 1150. Simultaneously, the counter 1140 outputs a value corresponding to the integer number (m) of periods T counted during the $T_{SKIP}$ period.

At the end of the $T_{SKIP}$ period, the output current $I_{OUT}$ of the COT buck regulator in DCM mode may be determined based on Equation (4):

$$I_{OUT} = \frac{I_{mid} * (n + a)}{(n + a) + (m + b)}, \quad (4)$$

where n is the integer number of T periods counted during the ($T_{ON}$+$T_{OFF}$) period, a is the fraction of the T period counted during ($T_{ON}$+$T_{OFF}$) period, n is the integer number of T periods counted during the $T_{SKIP}$ period, and b is the fraction of the T period counted during the $T_{SKIP}$ period. The value of $I_{mid}$ is determined as the value of current coincident with the midpoint of the inductor ripple current during the TON period. Because the TON is a known fixed value, the value of Imid may be determined, as previously described herein.

In another embodiment, separate asynchronous timer/counter logic may be performed to determine the values of n, a, m, and b in the ($T_{ON}$+$T_{OFF}$) and $T_{SKIP}$ periods, respectively. In this case, a single controller 1170 may be used to control both timer/counter logic or separate controllers may be used.

Figure 14:
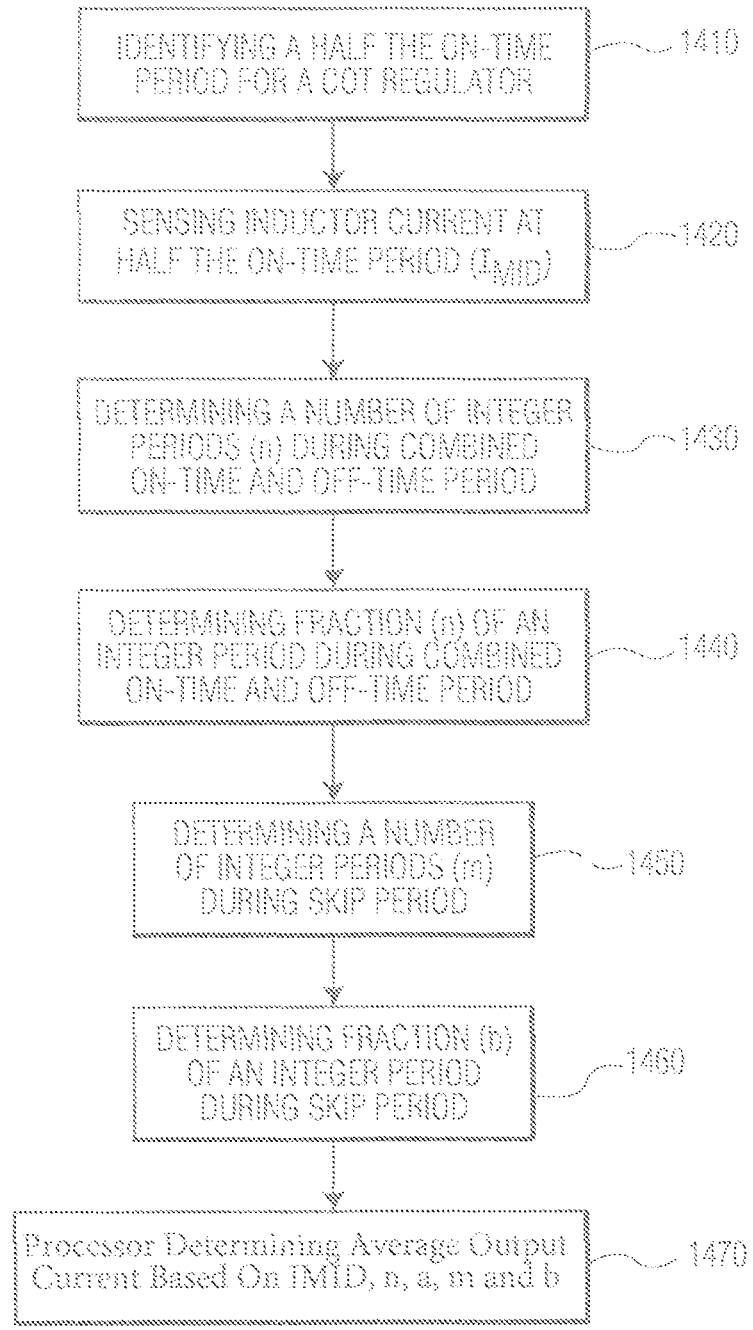
FIG. 14 illustrates an embodiment of a method for determining output current of the regulator of FIG. 1 operating in DCM mode.

FIG. 14 illustrate a method for monitoring current in a constant on-time regulator, which, for example, may be a constant on-time regulator operating in DCM mode as previously discussed. The method may adopt the operations described herein for DCM mode operation. At 1410, the method includes identifying half the on-time period for the COT regulator. At 1420, inductor current that exists at the half on-time period is determined (in the manner previously described). At 1430, the number of integer periods (n) is determined during the combined on-time and off-time period. At 1440, the fraction (a) of the integer period during the combined on-time and off-time period is determined, if such a fraction exists. At 1450, the number of integer periods (m) that exists during the skip period is determined. At 1460, the fraction (b) of the integer period during the skip period is determined, if such a fraction exists. At 1470, the output current of the COT regulator is determined based on inductor current at the half on-time period and values n, a, m, and b.

Figure 15:
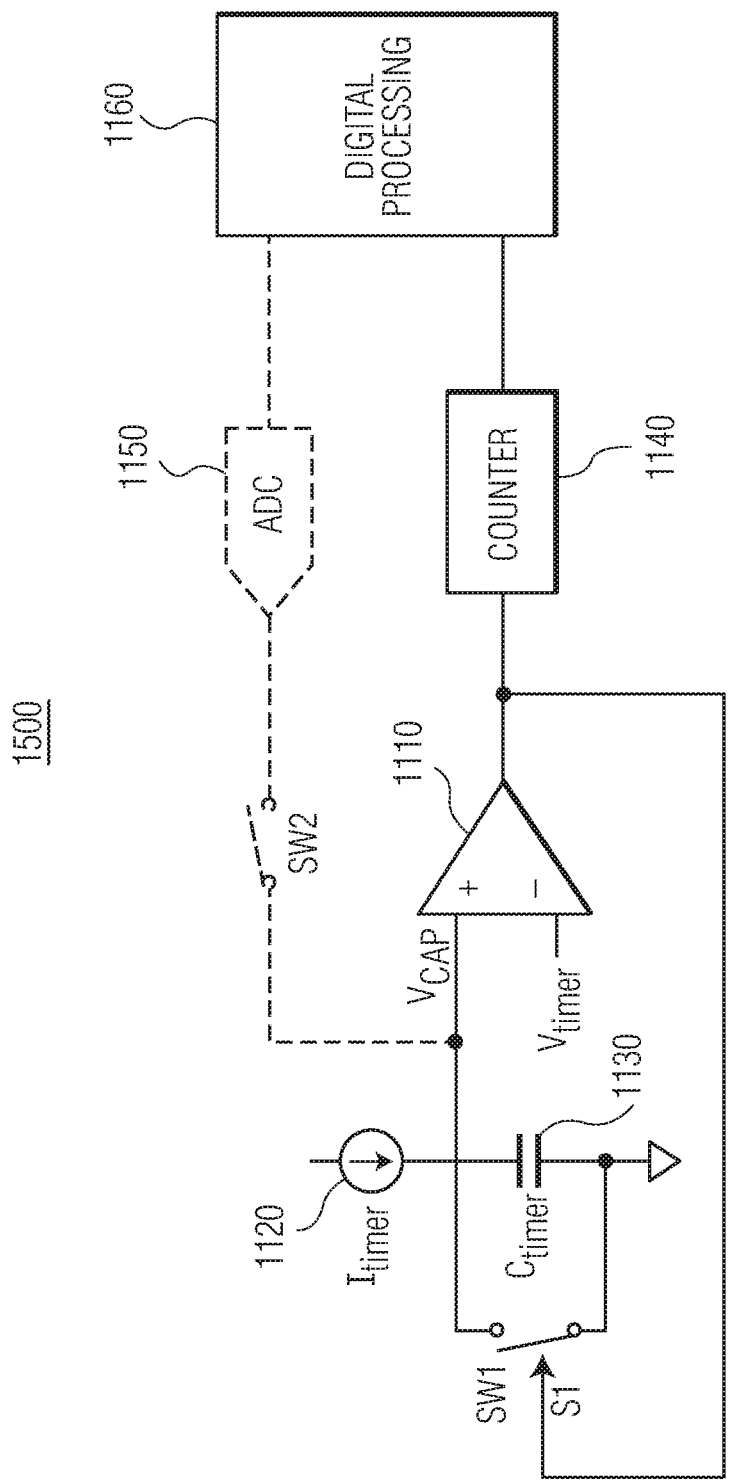
FIG. 15 illustrates another embodiment of counter/timer logic.

FIG. 15 illustrates another embodiment of asynchronous timer/counter logic 1500 that may be used to determine the output current $I_{OUT}$ of the COT buck regulator. Asynchronous timer/counter logic 1400 may be used, for example, when different timer/counter logic is used to determine the values of Equation (4) for the combined ($T_{ON}$+$T_{OFF}$) and $T_{SKIP}$ periods, respectively. In this case, the timer/counter logic of FIG. 11 may be used for the combined ($T_{ON}$+$T_{OFF}$) period and asynchronous timer/counter logic 1400 may be used during the $T_{SKIP}$ period.

This embodiment of FIG. 15 may be used, for example, when the load current is relatively small (e.g., below a predetermined value) and a higher level of efficiency is to be achieved. Because an analog-to-digital converter introduces inefficiencies, the embodiment of FIG. 15 may omit the analog-to-digital converter 1150 and its corresponding switch SW2. By omitting these features, asynchronous timer/counter logic 1400 may only determine the integer values of period T during the ($T_{ON}$+$T_{OFF}$) period in CCM mode and during the $T_{SKIP}$ period in DCM mode. In this latter case, the timer/counter logic of FIG. 11 may be used for the combined ($T_{ON}$+$T_{OFF}$) period and asynchronous timer/counter logic 1400 may be used during the $T_{SKIP}$ period. With the exception of the analog-to-digital converter 1150 and the second switch SW2, timer/counter logic 1400 may have the same features as the timer/counter logic in FIG. 11 including the controller 1170.

The asynchronous timer/counter logic of FIG. 15 may generate an accurate value of $I_{OUT}$ when the load current is small, even though the fractional values of T in the ($T_{ON}$+$T_{OFF}$) and/or $T_{SKIP}$ periods are not taken into consideration. This is because a low load current may be accompanied by a much longer $T_{SKIP}$ period, e.g., one much longer than the combined ($T_{ON}$+$T_{OFF}$) period. As a result, the integer value of m will be relatively large. When m is greater than a predetermined number, the fractional b value becomes insignificant and thus may be ignored for purposes of determining the output current $I_{OUT}$ of the COT buck regulator. Thus, in accordance with one embodiment, the average output current $I_{OUT}$ of the COT buck regulator may be determined by Equation (5), which corresponds to Equation (4) when b=0. The current $I_{MID}$ may be determined in the same manner as previously described based on the known fixed value of $T_{ON}$.

$$I_{OUT} = \frac{I_{mid} * (n + a)}{(n + a) + m}, \quad (5)$$

As an alternative to FIG. 15, the asynchronous timer/counter logic of FIG. 11 may be used when the load current is small and m is greater than a predetermined value. In this case, the controller 1170 may generate a disable signal to turn off the analog-to-digital converter 1150. This may allow single timer/counter logic to be used to compute the n, a, and m values of Equation (5).

Figure 16:
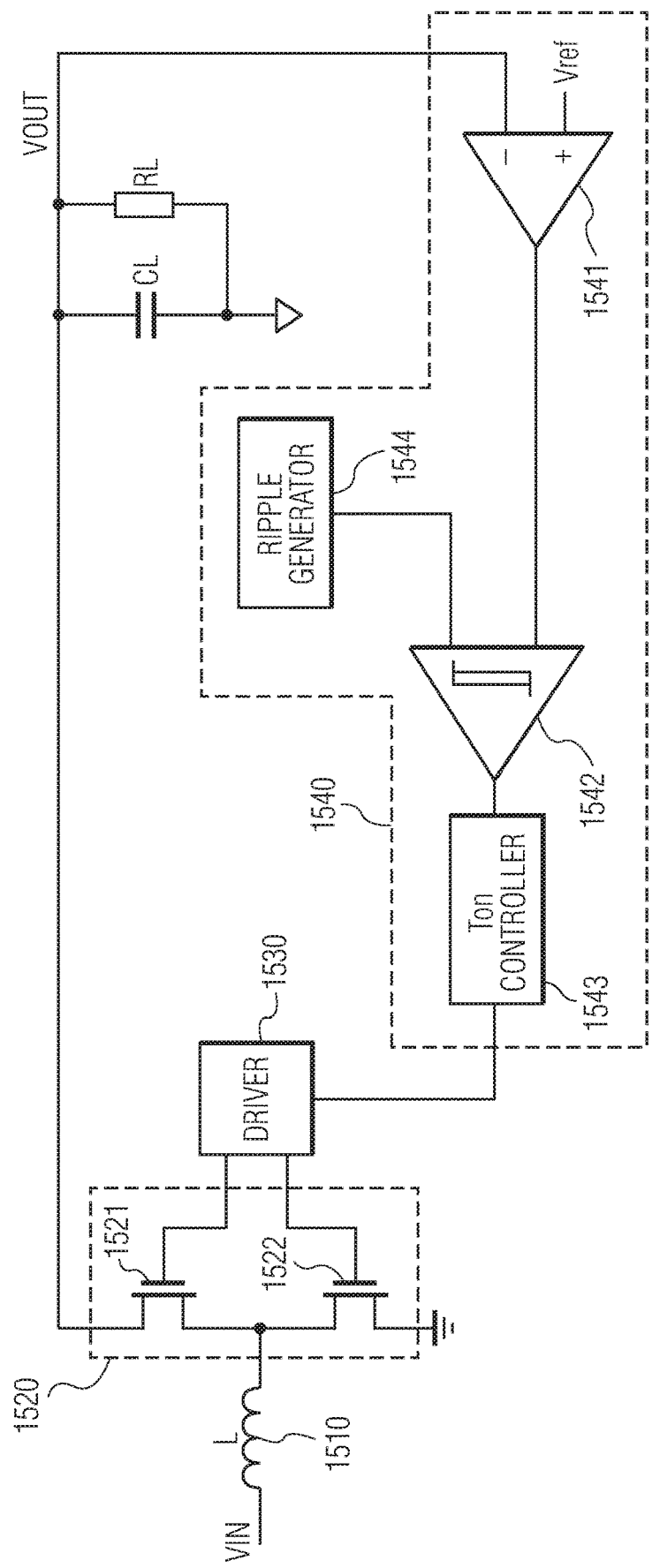
FIG. 16 illustrates an embodiment of a continuous on-time boost regulator.

FIG. 16 illustrates an embodiment of a COT boost regulator which may be similar to the COT buck regulator of FIG. 1, except that the inductor is coupled to the input of the regulator. More specifically, the COT boost regulator includes an inductor 1510, a switching circuit 1520, and a driver 1530. In operation, the driver 1530 may turn on the first transistor 1521 in the switching circuit to allow the output of the inductor to power the load (RL), after being filtered by capacitor CL. As in the case of the COT buck regulator embodiments, the low-side transistor 1522 is switched on during the on-time TON and off during the off-time TOFF. Conversely, the high-side transistor 1521 is switched on during the off-time TOFF of transistor 1522 and switched off during the on-time TON of transistor 1522.

In addition to these features, a feedback circuit 1540 includes a first comparator 1541, an integrator 1542, and a on-time ($T_{ON}$) controller 1543. These features and ripple generator 1544 may operate in an analogous manner as the feedback circuit 50 in FIG. 1. The same waveforms, timer/counter logic, and other circuits (e.g., FIGS. 2 to 14) may be used to determine the average input current $I_{IN}$ of the COT boost regulator. Also, the method and current monitor embodiments described herein may be applied in an analogous manner to determine the input current of the COT boost regulator of FIG. 16.

The processors, controllers, generators, drivers, comparators, current sense logic, integrators, converters, counters, and other signal generating and signal processing features of the embodiments disclosed herein may be implemented in logic which, for example, may include hardware, software, or both. When implemented at least partially in hardware, the processors, controllers, generators, current sense logic, drivers, comparators, integrators, converters, counters, and other signal generating and signal processing features may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the processors, controllers, generators, drivers, comparators, integrators, current sense logic, converters, counters, and other signal generating and signal processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Although the various exemplary embodiments have been described in detail with particular reference to certain exemplary aspects thereof, it should be understood that the invention is capable of other example embodiments and its details are capable of modifications in various obvious respects. As is readily apparent to those skilled in the art, variations and modifications can be affected while remaining within the spirit and scope of the invention. Accordingly, the foregoing disclosure, description, and figures are for illustrative purposes only and do not in any way limit the invention, which is defined only by the claims.

I claim:

1. A current monitor, comprising:
   current sense logic configured to sense inductor current at a predetermined time point during operation of a constant on-time regulator; and
   a processor configured to determine output current of the constant on-time regulator based on the inductor current sensed at the predetermined time point,
   wherein the predetermined time point corresponds to half of an on-time period of the constant on-time regulator;
   wherein the constant on-time regulator is configured to operate in a discontinuous conduction mode (DCM); and
   wherein the processor is configured to determine the output current by calculating an average value of the output current based on the on-time period, an off-time period, and a skip period, and the inductor current sensed at half the on-time period.

2. The current monitor of claim 1,
   wherein the constant on-time regulator is configured to operate in continuous conduction mode (CCM) and the output current is equal to the inductor current sensed at half the on-time period.

3. The current monitor of claim 2,
   wherein a transistor coupled to the inductor of the constant on-time regulator is switched on during the on-time period to generate the inductor current.

4. The current mirror of claim 1, further comprising at least one timer/counter logic that is configured to:
   (a) determine a number of integer periods that exist during a combined period that includes the on-time period and the off-time period;
   (b) determine a fraction of an integer period that exists during the combined period;
   (c) determine a number of integer periods that exist during the skip period; and
   (d) determine a fraction of the integer period that exists during the skip period,
   wherein the processor is configured to calculate the average value of the output current based on (a) to (d) and the inductor current sensed at half the on-time period.

5. The current mirror of claim 4,
   wherein the at least one timer/counter logic is configured to determine the fraction of the integer period in (b) by determining a voltage stored in a capacitor during the combined period, the voltage between an initial voltage and a timer voltage that corresponds to full integer period.

6. The current mirror of claim 4,
   wherein the at least one timer/counter logic is configured to determine the fraction of the integer period in (d) by determining a voltage stored in a capacitor during the skip period, the voltage between an initial voltage and a timer voltage that corresponds to full integer period.

7. The current mirror of claim 4,
   wherein the integer period is less than the on-time period.

8. The current mirror of claim 1,
   wherein the constant on-time regulator is a buck regulator or a boost regulator.

9. A method for monitoring operation of a circuit, comprising:
   identifying a predetermined time point for a constant on-time regulator;
   detecting start of an on-time period of the constant on-time regulator;
   sensing inductor current at the predetermined time point of the on-time period; and
   determining output current of the constant on-time regulator based on the inductor current sensed at the predetermined time point, wherein the predetermined time point corresponds to half the on-time period and the inductor current is sensed at half the on-time period;
   wherein the constant on-time regulator is configured to operate in a discontinuous conduction mode (DCM); and
   wherein determining the output current includes calculating an average value of the output current based on the on-time period, an off-time period, and a skip period, and the inductor current sensed at half the on-time period.

10. The method of claim 9,
    wherein the constant on-time regulator is configured to operate in a continuous conduction mode (CCM) and the output current is equal to the inductor current sensed at half the on-time period.

11. The method of claim 10,
wherein a transistor coupled to the inductor of the constant on-time regulator is switched on during the on-time period to generate the inductor current.

12. The method of claim 9, further comprising:
(a) determining a number of integer periods that exist during a combined period that includes the on-time period and the off-time period;
(b) determining a fraction of an integer period that exists during the combined period;
(c) determining a number of integer periods that exist during the skip period;
(d) determining a fraction of the integer period that exists during the skip period; and
(e) calculating the average value of the output current based on (a) to (d) and the inductor current sensed at half the on-time period.

13. The method of claim 12, wherein:
determining the fraction of the integer period in (b) includes determining a voltage stored in a capacitor during the combined period, the voltage between an initial voltage and a timer voltage that corresponds to full integer period.

14. The method of claim 12, wherein:
determining the fraction of the integer period in (d) includes determining a voltage stored in a capacitor during the skip period, the voltage between an initial voltage and a timer voltage that corresponds to full integer period.

15. The method of claim 12,
wherein the integer period is less than the on-time period.

16. The method of claim 9,
wherein the constant on-time regulator is a buck regulator or a boost regulator.

17. A current monitor, comprising:
current sense logic configured to sense inductor current at a predetermined time point during operation of a constant on-time regulator; and
a processor configured to determine output current of the constant on-time regulator based on the inductor current sensed at the predetermined time point,
wherein the predetermined time point corresponds to any point within an on-time period of the constant on-time regulator;
wherein the constant on-time regulator is configured to operate in a discontinuous conduction mode (DCM); and
wherein the processor is configured to determine the output current by calculating an average value of the output current based on the on-time period, an off-time period, and a skip period, and the inductor current sensed at any point within the on-time period.

* * * * *